United States Patent
Tanahashi et al.

(10) Patent No.: US 7,784,001 B2
(45) Date of Patent: Aug. 24, 2010

(54) CIRCUIT DESIGN METHOD, CIRCUIT DESIGN SYSTEM, AND PROGRAM PRODUCT FOR CAUSING COMPUTER TO PERFORM CIRCUIT DESIGN

(75) Inventors: Shuji Tanahashi, Kawasaki (JP); Kenichi Ushiyama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 254 days.

(21) Appl. No.: 11/352,231

(22) Filed: Feb. 13, 2006

(65) Prior Publication Data
US 2007/0079270 A1    Apr. 5, 2007

(30) Foreign Application Priority Data
Sep. 30, 2005    (JP)    ............................... 2005-287535

(51) Int. Cl.
*G06F 17/50*    (2006.01)

(52) U.S. Cl. .................................. 716/5; 716/1; 716/19

(58) Field of Classification Search ..................... 716/1, 716/5, 19
See application file for complete search history.

(56) References Cited

U.S. PATENT DOCUMENTS
2003/0079191 A1 *    4/2003    Savithri et al. .................. 716/4

FOREIGN PATENT DOCUMENTS
| JP | 59-003949 A | 1/1984 |
| JP | 2001-237326 A | 8/2001 |
| JP | 2004-199290 A | 7/2004 |

* cited by examiner

*Primary Examiner*—Thuan Do
(74) *Attorney, Agent, or Firm*—Fujitsu Patent Center

(57) ABSTRACT

In a circuit design method, a computer verifies an occurrence of a noise error, specifies a noise allowable value with respect to a cell at which it is determined that the noise error occurs, and determines a parameter value used in a process step. The parameter value satisfies the noise allowable value specified with respect to the cell at which the noise error occurs.

11 Claims, 6 Drawing Sheets

US 7,784,001 B2

CIRCUIT DESIGN METHOD, CIRCUIT DESIGN SYSTEM, AND PROGRAM PRODUCT FOR CAUSING COMPUTER TO PERFORM CIRCUIT DESIGN

BACKGROUND OF THE INVENTION

1. Field of the Invention

The present invention generally relates to a circuit design method for designing an integrated circuit, a circuit design system, and a program for causing a computer to perform a circuit design, and more particularly to the circuit design method, the circuit design system, and the program for causing the computer to perform the circuit design, in which instead of increasing a short TAT (Turn Around Time) and a chip surface area, a cross-talk noise can be suppressed.

2. Description of the Related Art

In a conventional circuit design technology of an integrated circuit, when a cross-talk noise error is corrected, in order to eliminate a cross-talk noise error, circuits are re-arranged and re-wired by additionally providing buffers and spaces (buffering and spacing).

Moreover, Japanese Laid-open Patent Application No. 59-3949 offers to arrange a level shift element capable of changing a threshold voltage of an input buffer gate.

However, in the conventional circuit design method, in a case of conducting the buffering, a quantity of buffers is increased. Also, in a case of performing the spacing, an extra space area is increased. As a result, a chip size is increased. Moreover, in a conventional modification of a chip layout, the circuits are repeatedly arranged and wired until the cross-talk error is eliminated. Once the circuits are re-arranged and re-wired, it is required to extract a resistance value and a capacitance value again, and to perform a delay calculation again. Accordingly, an increase of a man-hour is caused. Also, in this case, a new error can be detected, and also, various increases related to a gate size (an increase of an arrangement area and an increase of a power supply) are caused.

In addition, in a configuration of the integrated circuit disclosed in the Japanese Laid-open Patent Application No. 59-3949, there are the same problems in a case of a re-arrangement and a re-wiring by arranging the level shift element.

SUMMARY OF THE INVENTION

It is a general object of the present invention to provide a circuit design method for designing an integrated circuit, a circuit design system, and a program for causing a computer to perform a circuit design, in which the above-mentioned problems are eliminated.

Another and more specific object of the present invention is to provide the circuit design method for designing an integrated circuit, the circuit design system, and the program for causing a computer to perform a circuit design, in which an occurrence of a cross-talk noise can be suppressed, instead of increasing a short TAT and a chip surface area.

Another more specific object of the present invention is to provide a circuit design method for causing a computer to conduct a circuit design, including the steps: (a) verifying an occurrence of a noise error; (b) specifying a noise allowable value with respect to a cell in which the step (a) determines that the noise error occurs; and (c) determining a parameter value used in a process step, the parameter value satisfying the noise allowable value specified in the step (b).

In a circuit design method according to the above invention, it is possible to eliminate an occurrence of a noise error caused by a cross-talk by simply changing an ion implantation concentration in a process step, instead of changing information concerning a configuration of physical cells.

The above objects of the present invention can be achieved by a program for causing a computer to conduct the above-described steps in the circuit design method, by a computer-readable recording medium recorded with the program, or by a simulation system concerning the circuit design in which the above-described steps are conducted.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENT

In the following, an embodiment according to the present invention will be described with reference to the accompanying drawings.

Figure 1:
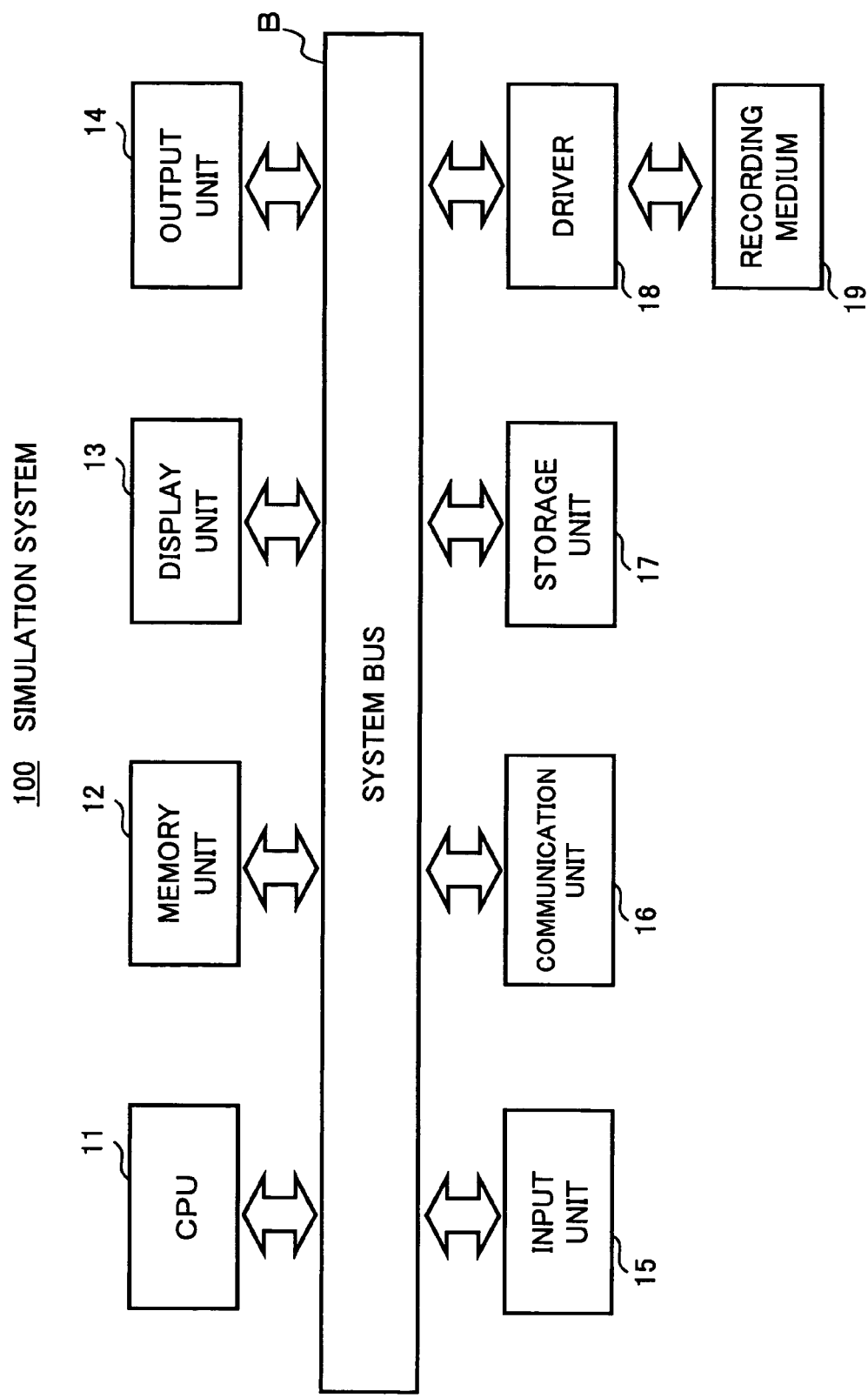
FIG. 1 is a block diagram showing a hardware configuration of a simulation system according to an embodiment of the present invention.

A simulation system realizing a circuit design method according to the present invention is a computer, and includes a hardware configuration as shown in FIG. 1. FIG. 1 is a block diagram showing the hardware configuration of the simulation system according to an embodiment of the present invention.

In FIG. 1, the simulation system 100 is an apparatus controlled by the computer, and includes a CPU (Central Processing Unit) 11, a memory unit 12, a display unit 13, an output unit 14, an input unit 15, a communication unit 16, a storage unit 17, and a driver 18, which are mutually connected via a system bus B.

The CPU 11 controls the simulation system 100 in accordance with programs stored in the memory unit 12. The memory unit 12 includes a RAM (Random Access Memory), a ROM (Read-Only Memory), and a like. The memory unit 12 stores programs executed by the CPU 11, data necessary for processes conducted by the CPU 11, data obtained in the processes conducted by the CPU 11, and a like. In addition, a memory area of the memory unit 12 is partially assigned to a work area and used in the processes conducted by the CPU 11.

The display unit 13 is used to display various necessary information by a control of the CPU 11. The output unit 14 includes a printer and a like, and used to output various information in response to an instruction from a user. The input unit 15 includes a mouse, a keyboard, and a like, and is used for the user to input various necessary information for processes which the simulation system 100 conducts.

The communication unit 16 is a unit by which the simulation system 100 controls a communication through a network, for example, the Internet, a LAN (Local Area Network), and a like.

The storage unit 17 includes a hard disk unit, and stores data such as the programs for conducting various processes.

For example, a program, which realizes a process in a circuit design method conducted by the simulation system 100, are loaded into the simulation system 100 by installing from a recording medium 19 such as a CD-ROM (Compact Disk Read-Only Memory) or a like. That is, when the recording medium 19 storing the program is set to the driver 18, the driver 18 reads out the program from the recording medium 19. The program read from the recording medium 19 is installed into the storage unit 17 through the system bus B. When the program is activated, the CPU 11 begins the process in accordance with the program installed into the storage unit 17.

It should be noted that a medium storing the program is not limited to the CD-ROM but any computer-readable medium may be used. Also, in a case in that the simulation system 100 includes an interface such as a USB (Universal Serial Bus), or a like to connect to an external device, the program may be read out and installed from an external storage medium by a USB connection.

Figure 2:
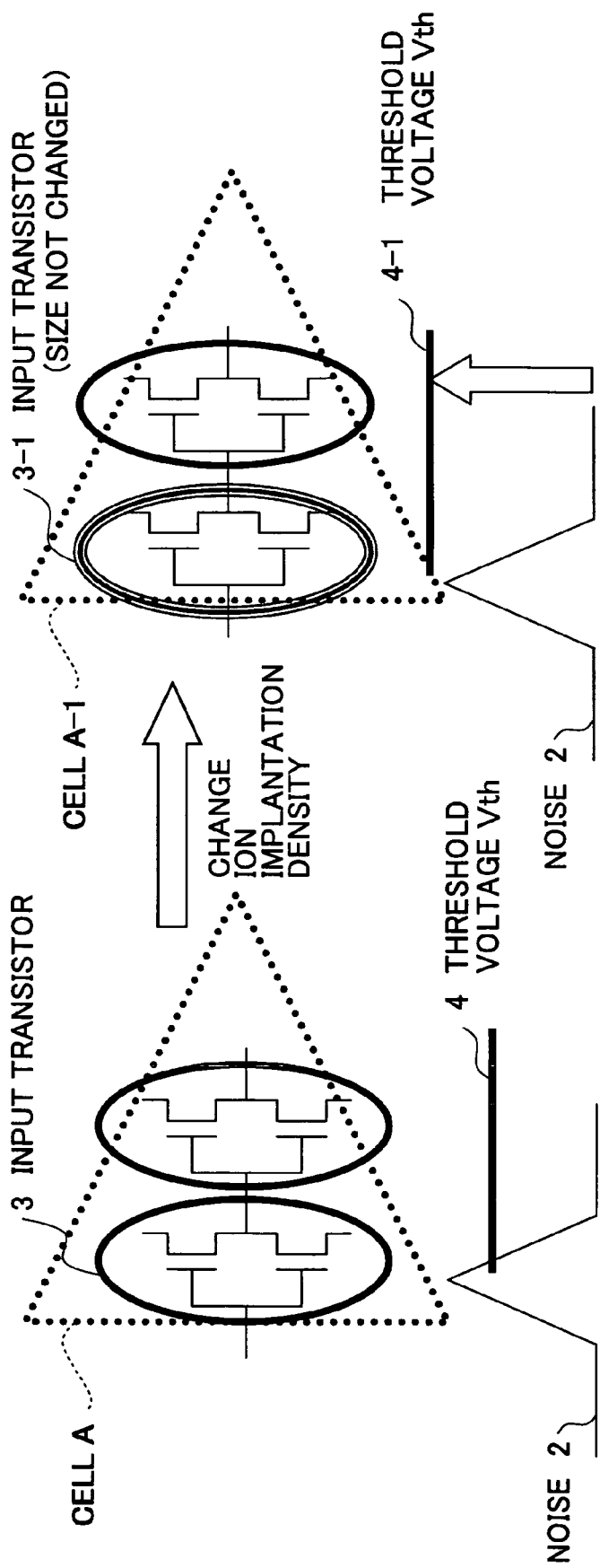
FIG. 2 is a diagram for explaining a circuit design process according to the embodiment of the present invention.

The circuit design process conducted by the CPU 11 of the simulation system 100 will be briefly described with -reference to FIG. 2. FIG. 2 is a diagram for explaining the circuit design process.

In FIG. 2, when in a cross-talk verification, a noise 2 exceeds a threshold voltage Vth 4 at a cell A being wired and arranged, the cell A is detected as an error cell.

In the present invention, when an error that does not satisfy the threshold voltage Vth 4 is detected at the cell A, and a configuration of a transistor 3 at an input side (hereinafter, called an input transistor) of the cell A is changed with respect to a process of the cell A. Instead of changing a size of the cell A, and conducting buffering and spacing, the circuit design process is conducted. That is, the cell A having the error is replaced with a cell A-1 including an input transistor 3-1 in which ion implantation concentration is changed. In the input transistor 3-1 in which the ion implantation concentration is changed, since the threshold voltage Vth 4 of the cell A is increased to a threshold voltage Vth 4-1, it is possible to avoid an influence of the noise 2. Also, since only the ion implantation concentration is changed, the size of the cell A-1 is the same as the size of the cell A, and the size is not changed.

Next, the circuit design process according to the present invention will be described with reference to FIG. 3 through FIG. 6. In FIG. 3 through FIG. 6, a layout circuit information table 34, a noise allowable value library 40, and a physical library 50 are stored in the storage unit 17. Also, in the following, the circuit design process will be described by using a term "alternative cell". The alternative cell is not information to be replaced with information concerning a physical cell configuration but indicates information to be replaced by using a library indicating parameter value which is referred in a process step. The alternative cell indicates information other than the physical cell configuration.

Figure 3:
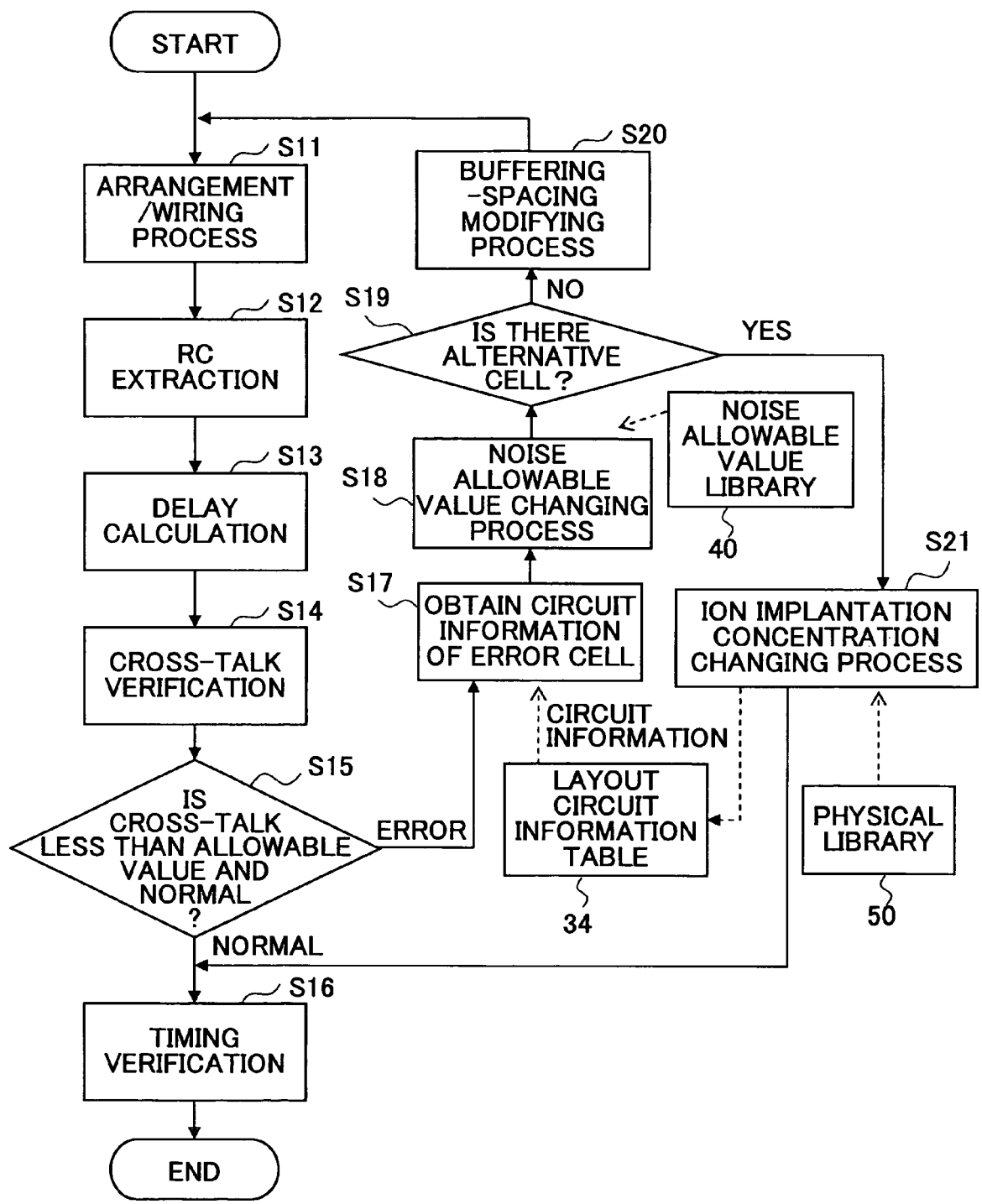
FIG. 3 is a flowchart for explaining the entire circuit design process according to the embodiment of the present invention.

FIG. 3 is a flowchart for explaining the entire circuit design process. In FIG. 3, the CPU 11 of the simulation system 100 arranges a plurality of cells on a substrate, and conducts a wiring process among the plurality of cells (step S11). After that, an RC extraction (extraction of a resistance value and a capacitance value) of an integrated circuit in which the wiring process is conducted to each of the plurality of cells (step s12). Results from the steps S11 and S12 are stored as layout circuit information concerning circuits being laid out in the layout circuit information table 34 every time.

The CPU 11 calculates a delay time for each wiring path (step S13). Furthermore, the CPU 11 conducts the cross-talk verification for each cell (step S14). By using a verification result, the CPU 11 determines whether or not the cross-talk is lower than an allowable value and normal (step S15). When the cross-talk is normal, the CPU 11 conducts a timing verification (step S16), and terminates the circuit design process.

On the other hand, when the cross-talk exceed the allowed value and an error is detected, the CPU 11 retrieves circuit information concerning a cell (error cell) in which an error is detected step S17). Then, the CPU 11 executes a noise allowable value changing process which is a process for conducting a cross-talk verification for each change of a noise allowable value by using the noise allowable value library 40 corresponding to the error cell specified by using the layout circuit information table 34. Subsequently, the CPU 11 selects the alternative cell from the noise allowable value library 40 (step S18).

The CPU 11 determines whether or not the alternative cell is successfully selected in the noise allowable value changing process (step S19). When the alternative cell is not selected, the CPU 11 conducts a modification process using a conventional buffering and spacing (step S20). Then, the CPU 11 goes back to the step S11, and repeats the above described steps. On the other hand, when the alternative cell is successfully selected, the CPU 11 obtains the ion implantation concentration corresponding to the alternative cell from the physical library 50, conducts an ion implantation concentration changing process which is a process for changing an ion implantation concentration of the error cell in the layout circuit information table 34 (step S21), and executes the timing verification (step S16). After that, the CPU 11 terminates the circuit design process.

Figure 4:
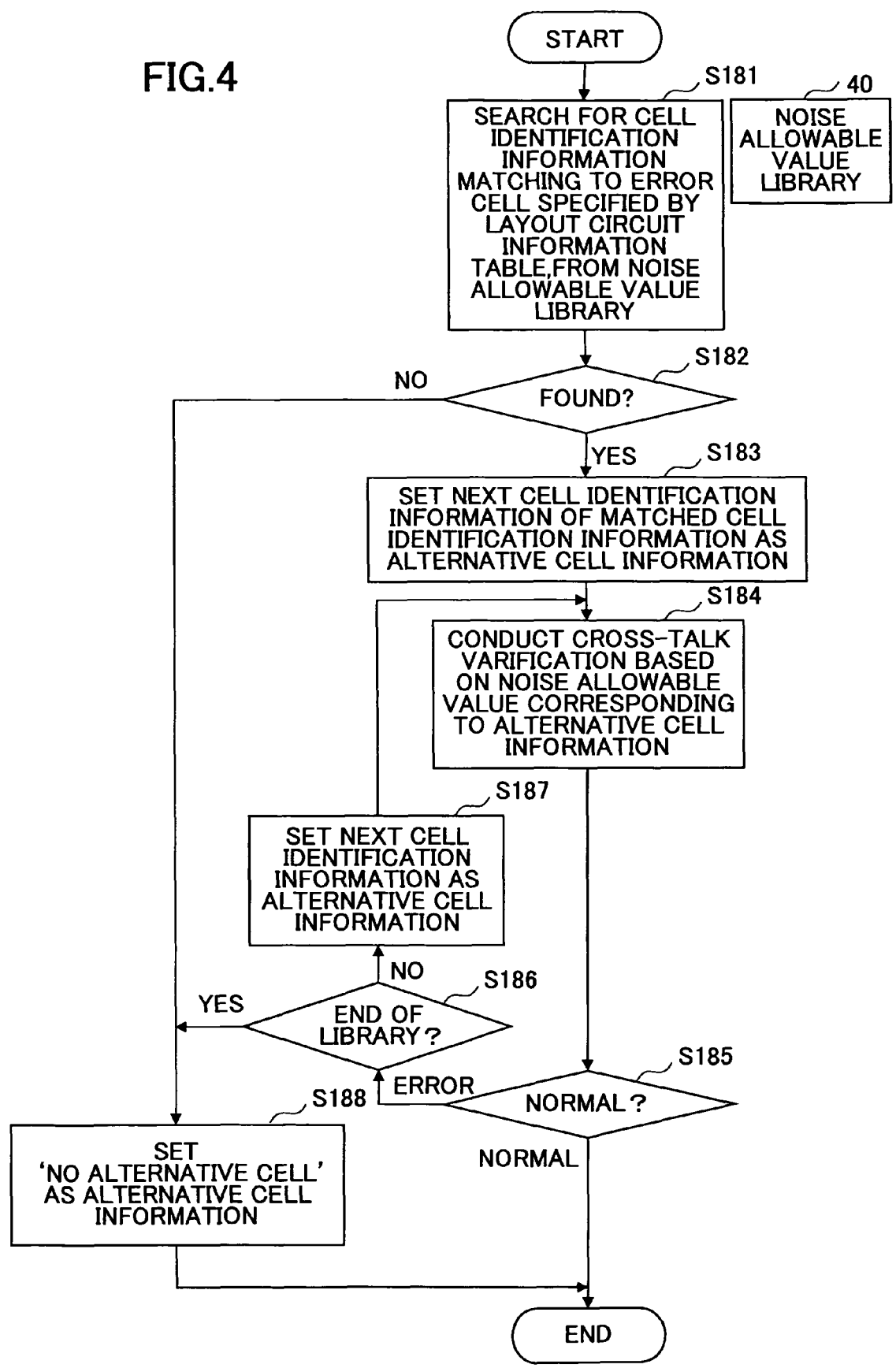
FIG. 4 is a flowchart for explaining a noise allowable value changing process in step S18 in FIG. 3, according to the embodiment of the present invention.

The noise allowable value changing process conducted in the step S18 shown in FIG. 3 will be described with reference to FIG. 4. FIG. 4 is a flowchart for explaining the noise allowable value changing process.

In FIG. 4, the CPU 11 searches for cell identification information corresponding to the error cell specified in the layout information table 34, from the noise allowable value library 40 (step S181). The CPU 11 determines whether or not the cell identification information corresponding to the error cell is found (step S182).

When the cell identification information is found until an end of the noise allowable value library 40, the CPU 11 advances to step S188, sets information indicating "no alternative cell" as alternative cell information, and terminates the noise allowable value changing process. In this case, in step S20 shown in FIG. 3, the CPU 11 conducts the modification process using the conventional buffering and spacing.

On the other hand, when the cell identification information corresponding to the error cell, the CPU 11 sets the next cell identification information following the cell identification information corresponding to the error cell (step S183).

Next, the CPU 11 conducts the cross-talk verification based on the noise allowable value corresponding to the alternative cell information by referring to the noise allowable value library 40 (step S184). The CPU 11 determines whether or not a result of the cross-talk verification is normal (step S185). When the result is normal, the CPU 11 terminates the noise allowable value changing process.

In this case, in the step S21 shown in FIG. 3, the CPU 11 obtains the ion implantation concentration corresponding to the alternative cell information from the physical library 50. The CPU 11 replaces the ion implantation concentration of the error cell in the layout circuit information table 34, by using the ion implantation concentration. As described above, since only the ion implantation concentration is changed, it is not required to change the information concerning the physical cell configuration. If necessary, the CPU 11 may obtain the noise allowable value corresponding to the alternative cell information from the noise allowable value library 40, and may replace a noise allowable value concerning the error cell with the obtained noise allowable value corresponding to the alternative cell information.

On the other hand, when the result from the cross-talk verification indicates an error, the CPU 11 determines whether or not the cross-talk verification is conducted until the end of the noise allowable value library 40, by determining whether or not the cell identification information indicated by the alternative cell information is a latest cell identification information of the noise allowable value library 40 (step S186).

When it is determined that the cross-talk verification is conducted until the end of the noise allowable value library 40, the CPU 11 advances to the step S188. In the step S188, the CPU 11 sets "no alternative cell" to the alternative information, and terminates the noise allowable value changing process. In this case, in the step S20 shown in FIG. 3, the CPU 11 conducts the modification process using the conventional buffering and spacing.

On the other hand, when it is determined that the cross-talk verification is not conducted until the end of the noise allowable value library 40, the CPU 11 sets next cell identification information following the cell identification information to the alternative cell information from the noise allowable value library 40 (step S187), goes back to the step S184, and repeats the above described steps.

Figure 5:
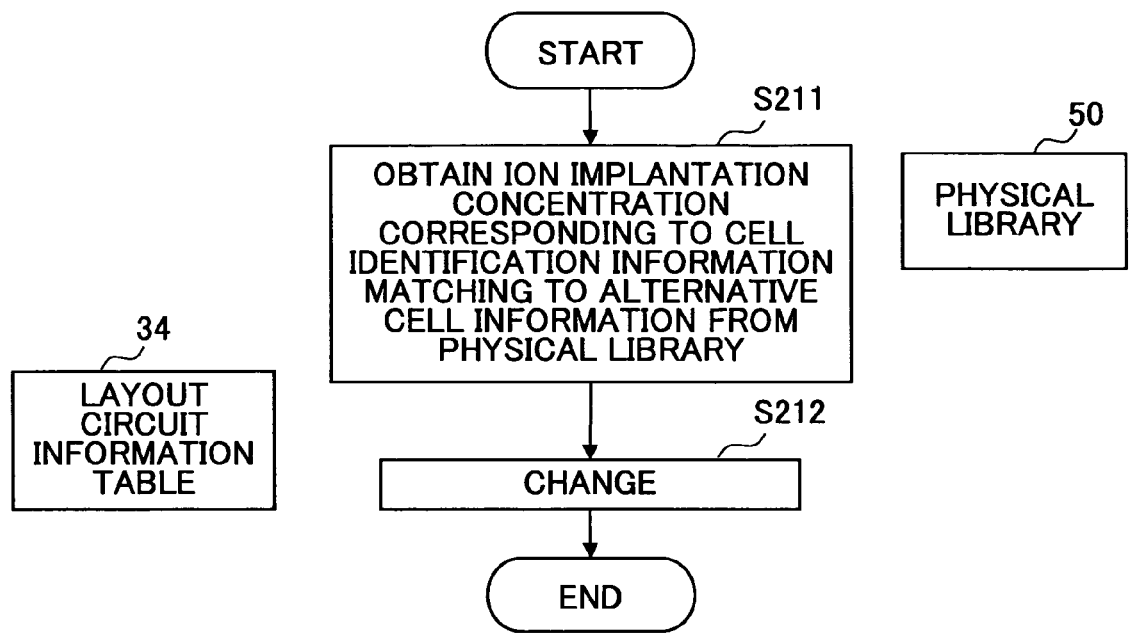
FIG. 5 is a flowchart for explaining an ion implantation concentration changing process according to the embodiment of the present invention.

Next, the ion implantation concentration changing process executed in the step S21 shown in FIG. 3 will be described with reference to FIG. 5. FIG. 5 is a flowchart for explaining the ion implantation concentration changing process. In FIG. 5, the CPU 11 specifies the cell identification information corresponding to the alternative cell information and obtains the ion implantation concentration corresponding to the cell identification information, from the physical library 50 (step S211).

Then, the CPU 11 changes the ion implantation concentration of the error cell of the layout circuit information table 34 to the ion implantation concentration obtained in step S211 (step S212), and terminates the ion implantation concentration changing process.

Accordingly, instead of replacing information concerning the physical cell configuration, that is, instead of repeating the arrangement and wiring for each change of the physical cell configuration, the ion implantation concentration is simply changed in the process step.

Figure 6:
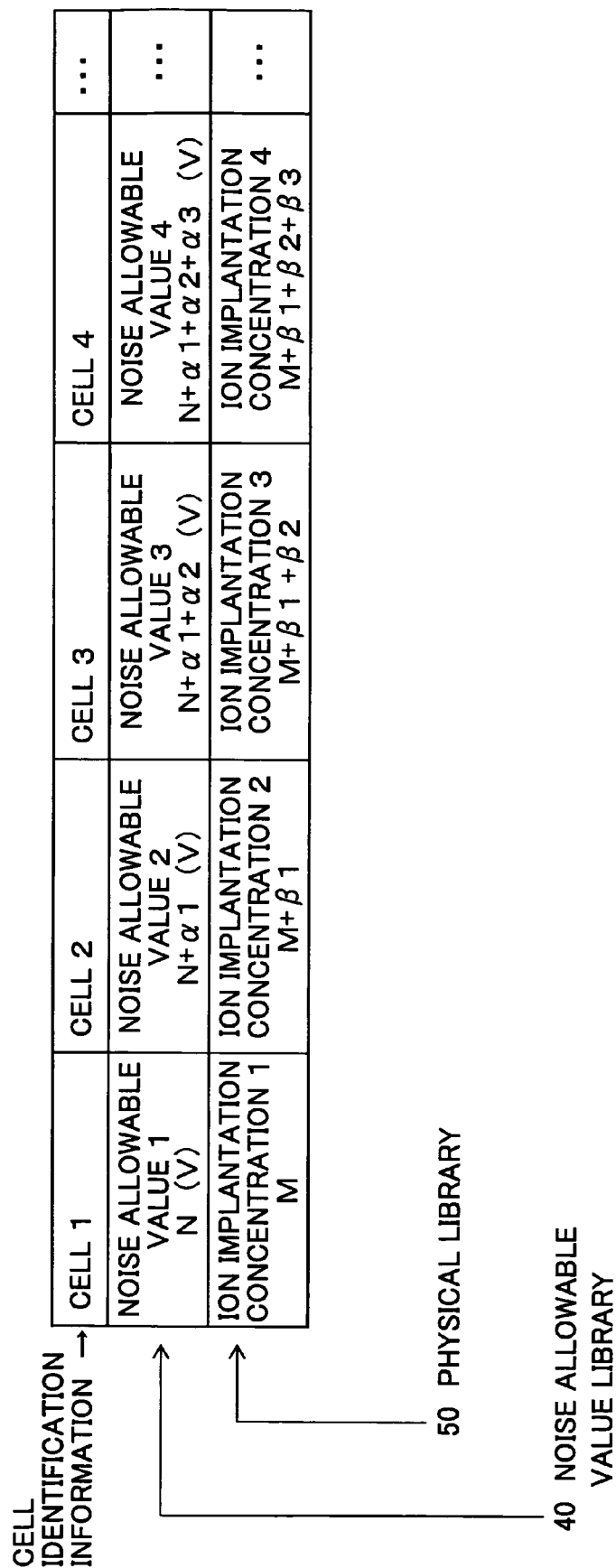
FIG. 6 is a diagram showing data structures of libraries according to the embodiment of the present invention.

Next, data structures of the noise allowable value library 40 and the physical library 50 will be described with reference to FIG. 6. In FIG. 6, the noise allowable value library 40 indicates a voltage N(V) as a noise allowable value 1, a voltage $N+\alpha 1(V)$ as a noise allowable value 2, a voltage $N+\alpha 1+\alpha 2$ (V), . . . for the cell identification information of each of a cell 1, a cell 2, a cell 3, . . . . In the noise allowable value library 40, the noise allowable values are managed so as to be sequentially higher from the cell 1.

Also, the physical library 50 indicates a concentration M as the ion implantation concentration 1, a concentration $M+\beta 1$ as an ion implantation concentration 2, a concentration $M+\beta 1+\beta 2$ as an ion implantation concentration 3, . . . for the cell identification information of each of the cell 1, the cell 2, the cell 3, . . . . In the physical library 50, the ion implantation concentrations are managed so as to be higher depending on the noise allowable values. That is, as shown in FIG. 1, in order for the threshold voltage Vth to be able to correspond to the noise allowable value, each of the ion implantation concentrations is set to be a higher threshold voltage Vth depending upon an increase of the noise allowable value.

As described above, in this embodiment, it is not required to change a cell itself. Since only the ion implantation concentration is changed in the process step, it is possible to avoid an occurrence of the noise error caused by the cross-talk.

According to the present invention, in a stage of the circuit design process, it is possible to increase the ion implantation concentration in an ion implantation step with respect to an I.I (Ion Implantation) layer of the input transistor, so as to acquire a higher threshold voltage Vth for a transistor connecting to an input terminal of a receiver at a Victim side at which the noise error caused by the cross-talk is detected. Accordingly, while maintaining the same cell size and the same physical pattern in a cell, it is possible to change the threshold voltage Vth of the transistor connecting to the input terminal.

Moreover, in the present invention, the simulation system 100 includes the noise allowable value library 40 indicating the noise allowable values which are sequentially increased corresponding to the cell identification information, and the physical library 50 indicating the threshold voltages Vth of the input transistor in which the threshold voltages Vth sequentially become higher corresponding to the noise allowable values for the cell identification information of each cell. By simply referring to the noise allowable value library 40 and the physical library 50, it is possible to determine the ion implantation concentration.

Accordingly, it is not required to modify the layout, and it is not required to repeat the arranging and wiring process, the RC extraction process, the delay calculation, and the like.

According to the preset invention, in the circuit design process, without changing information concerning the physical cell configuration, it is possible to avoid the occurrence of the noise error caused by the cross-talk by simply changing the ion implantation concentration in the process step.

The present invention is not limited to the specifically disclosed embodiments, and variations and modifications may be made without departing from the scope of the invention.

The present application is based on Japanese Priority Application No. 2005-287535 filed on Sep. 30, 2005, the entire contents of which are hereby incorporated by reference.

What is claimed is:

1. A circuit design method in a simulation system including a computer having computer-readable instructions embodied on a computer-readable medium, in which the computer-readable instructions when executed by the computer cause the computer to conduct the circuit design method comprising:
    (a) causing the computer to verify an occurrence of a noise error;
    (b) causing the computer to specify a noise allowable value with respect to a circuit cell in which the step (a) determines that the noise error occurs; and
    (c) causing the computer to determine a parameter value used in a process step, the parameter value satisfying the noise allowable value specified in the step (b),
    wherein the parameter value used in the process step indicates an ion implantation concentration.

2. The circuit design method as claimed in claim 1, wherein:

the step (a) causes the computer to verify the occurrence of the noise error by referring to the noise allowable values set in a noise allowable value library in a sequence from lower values, and causes the computer to specify one of the noise allowable values at which the noise error does not occur, wherein the noise allowable value library indicates the noise allowable values for cell identification information identifying each cell, and the noise allowable value library is stored in a storage area provided to the computer.

3. The circuit design method as claimed in claim 2, wherein:

the step (c) causes the computer to obtain the parameter value used in the process step corresponding to the cell identification information corresponding to a specified noise allowable value in the step (b), from a parameter value library, wherein the parameter value library indicates the parameter values each of which is possible to be used in the process step and satisfies a relative noise allowable value for the cell identification information for each cell, and the parameter value library is stored in the storage area provided to the computer.

4. The circuit design method as claimed in claim 1, wherein instead of changing a cell size, the step (c) causes the computer to determine the parameter value used in the process step, so that a threshold voltage becomes higher than a state in that the occurrence of the noise error is detected.

5. The circuit design method as claimed in claim 1, wherein the parameter value determined in the step (c) is a parameter value for the process step with respect to an input transistor of the cell.

6. A circuit design system in which a computer conducts a circuit design, comprising:

a verifying part verifying an occurrence of a noise error;

a specifying part specifying a noise allowable value with respect to a circuit cell in which the verifying part determines that the noise error occurs; and a determining part determining a parameter value of the error circuit cell used in a process step, with a parameter value satisfying the noise allowable value specified by the specifying part, wherein the parameter value used in the process step indicates an ion implantation concentration.

7. The circuit design system as claimed in claim 6, further comprising a noise allowable value library indicating noise allowable values for cell identification information identifying each cell, and being stored in a storage area provided to the computer, wherein the verifying part verifies the occurrence of the noise error by referring to the noise allowable values set in the noise allowable value library in a sequence from lower values, and specifies the noise allowable value at which the noise error does not occurs.

8. The circuit design system as claimed in claim 7, further comprising a parameter value library indicating the parameter values each of which is possible to be used in the process step and satisfies a relative noise allowable value for the cell identification information for each cell, and being stored in the storage area provided to the computer, wherein the determining part obtains the parameter value used in the process step corresponding to the cell identification information corresponding to a specified noise allowable value by the specifying part, from the parameter value library.

9. A program product for causing a computer to conduct a circuit design, said program product comprising a computer-readable medium encoded with a computer program that comprises the codes for:

(a) verifying an occurrence of a noise error;

(b) specifying a noise allowable value with respect to a circuit cell in which the code (a) determines that the noise error occurs; and (c) determining a parameter value used in a process step, the parameter value satisfying the noise allowable value specified by the code (b), wherein the parameter value used in the process step indicates an ion implantation concentration.

10. The program product as claimed in claim 9, further comprising a noise allowable value library indicating noise allowable values for cell identification information identifying each cell, and being stored in a storage area provided to the computer, wherein the code (a) verifies the occurrence of the noise error by referring to the noise allowable values set in the noise allowable value library in a sequence from lower values, and specifies one of the noise allowable values at which the noise error does not occur.

11. The program product as claimed in claim 10, further comprising a parameter value library indicating the parameter values that is possible to be used in the process step and satisfies a relative noise allowable value for the cell identification information for each cell, and being stored in the storage area provided to the computer, wherein the code (c) obtains the parameter value used in the process step corresponding to the cell identification information corresponding to a specified noise allowable value by the code (b), from a parameter value library.

* * * * *